(12) United States Patent
Lin et al.

(10) Patent No.: US 6,750,519 B2
(45) Date of Patent: Jun. 15, 2004

(54) DUAL METAL GATE PROCESS: METALS AND THEIR SILICIDES

(75) Inventors: Wenhe Lin, Singapore (SG); Mei-Sheng Zhou, Singapore (SG); Kin Leong Pey, Singapore (SG); Simon Chooi, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/266,714

(22) Filed: Oct. 8, 2002

(65) Prior Publication Data
US 2004/0065930 A1 Apr. 8, 2004

Related U.S. Application Data

(62) Division of application No. 09/981,415, filed on Oct. 18, 2001, now Pat. No. 6,475,908.

(51) Int. Cl.[7] ................. H01L 29/76; H01L 29/94; H01L 31/062; H01L 31/113; H01L 31/119
(52) U.S. Cl. ............ 257/407; 257/412; 257/369; 257/410; 257/288; 257/364; 257/365; 257/374; 257/392
(58) Field of Search ................... 257/412, 288, 257/364, 365, 368, 369, 371, 372, 374, 391, 392, 407, 410

(56) References Cited

U.S. PATENT DOCUMENTS

| | | | |
|---|---|---|---|
| 5,960,270 A | 9/1999 | Misra et al. | 438/197 |
| 6,043,157 A | 3/2000 | Gardner et al. | 438/692 |
| 6,051,487 A | 4/2000 | Gardner et al. | 438/585 |
| 6,066,544 A * | 5/2000 | Pan et al. | 438/424 |
| 6,083,836 A | 7/2000 | Rodder | 438/690 |
| 2002/0076886 A1 * | 6/2002 | Rotondaro et al. | 438/279 |

* cited by examiner

*Primary Examiner*—Nathan J. Flynn
*Assistant Examiner*—Victor A. Mandala, Jr.
(74) *Attorney, Agent, or Firm*—George O. Saile; Rosemary L. S. Pike (57) ABSTRACT

Methods for forming dual-metal gate CMOS transistors are described. An NMOS and a PMOS active area of a semiconductor substrate are separated by isolation regions. A metal layer is deposited over a gate dielectric layer in each active area. Silicon ions are implanted into the metal layer in one active area to form an implanted metal layer which is silicided to form a metal silicide layer. Thereafter, the metal layer and the metal silicide layer are patterned to form a metal gate in one active area and a metal silicide gate in the other active area wherein the active area having the gate with the higher work function is the PMOS active area. Alternatively, both gates may be metal silicide gates wherein the silicon concentrations of the two gates differ. Alternatively, a dummy gate may be formed in each of the active areas and covered with a dielectric layer. The dielectric layer is planarized thereby exposing the dummy gates. The dummy gates are removed leaving gate openings to the semiconductor substrate. A metal layer is deposited over a gate dielectric layer within the gate openings to form metal gates. One or both of the gates are silicon implanted and silicided. The PMOS gate has the higher work function.

8 Claims, 7 Drawing Sheets

DUAL METAL GATE PROCESS: METALS AND THEIR SILICIDES

RELATED PATENT APPLICATION

This is a division of U.S. patent application Ser. No. 09/981,415, filing date Oct. 18, 2001, A Dual Metal Gate Process: Metals and Their Silicides, assigned to the same assignee as the present invention, now U.S. Pat. No. 6,475,908.

BACKGROUND OF THE INVENTION (1) Field of the Invention

The present invention relates to the fabrication of integrated circuit devices, and more particularly, to a method of fabricating dual-metal transistors having different work functions in the fabrication of integrated circuits.

(2) Description of the Prior Art

It is anticipated that a single metal gate with mid-gap work function values will not be suitable for CMOS applications due to buried channel effects. By using a single metal gate for both NMOSFET and PMOSFET, the threshold voltage becomes too high for both types of transistors. In order to achieve a lower threshold voltage, additional implantation is required and this will result in buried channel effects. The short channel effect control will then be degraded. However, with dual metal gates having different work functions, additional implantation is not required. That is, one electrode with a lower work function will be used in the NMOSFET while another electrode with a higher work function will be used for the PMOSFET. That means that the threshold voltage for NMOSFET and PMOSFET can be tailored independently. It is desired to maintain the conventional CMOS process flow in the dual metal gate process.

U.S. Pat. No. 6,043,157 to Gardner et al shows a process for forming dual gates where one gate is polysilicon and the other gate is metal. U.S. Pat. No. 5,960,270 to Misra et al discloses a process wherein the same mid-gap work function metal is used for both n- and p-gates. U.S. Pat. No. 6,083,836 to Rodder teaches a dummy gate process where two gates are formed. For example, one gate is polysilicon and the other is aluminum. U.S. Pat. No. 6,051,487 to Gardner et al teaches a dummy gate process using a polysilicon or a metal gate.

SUMMARY OF THE INVENTION

Accordingly, a primary object of the invention is to provide a process for forming dual metal gates for CMOS transistors in the fabrication of integrated circuits.

A further object of the invention is to provide a process for forming dual-metal gate CMOS transistors having different work functions in the fabrication of integrated circuits.

Another object of the invention is to provide a process for forming dual-metal gate CMOS transistors where one gate comprises a metal and the other gate comprises the metal's silicide.

Yet another object of the invention is to provide a process for forming dual-metal gate CMOS transistors comprising a metal and the metal silicide.

A still further object of the invention is to provide a process for forming dual-metal gate CMOS transistors comprising a first metal silicide and a second metal silicide wherein the metal is the same in both gates and the silicide concentration is different.

In accordance with the objects of the invention, a method for forming dual-metal gate CMOS transistors is achieved. First and second active areas of a semiconductor substrate are separated by isolation regions. One of the active areas will be PMOS and the other will be NMOS. A gate dielectric layer is formed overlying the semiconductor substrate in each of the active areas. A metal layer is deposited overlying the gate dielectric layer. Silicon ions are implanted into the metal layer in the PMOS area to form an implanted metal layer and the implanted metal layer is silicided to form a metal silicide layer. Thereafter, the metal layer and the metal silicide layer are patterned to form a metal gate in a first active area and a metal silicide gate in a second active area to complete formation of dual-metal gate CMOS transistors in the fabrication of an integrated circuit. The metal silicide may have a higher or lower work function depending on the metal used. The PMOS gate will be formed from the gate having the higher work function.

Also, in accordance with the objects of the invention, a second method for forming dual-metal gate CMOS transistors is achieved. First and second active areas of a semiconductor substrate are separated by isolation regions. One of the active areas will be PMOS and the other will be NMOS. A dummy gate is formed in each of the active areas. The dummy gates are covered with a dielectric layer which is planarized whereby a top surface of each of the dummy gates is exposed. The exposed dummy gates are removed, leaving gate openings to the semiconductor substrate. A gate dielectric layer is formed overlying the semiconductor substrate in each of the gate openings. A metal layer is deposited within the gate openings to form metal gates. Silicon ions are implanted into the metal gate only in a first active area to form an implanted metal gate. The implanted metal gate is silicided to form a metal silicide gate in the first active area to complete formation of dual-metal gate CMOS transistors in the fabrication of an integrated circuit. The metal silicide may have a higher or lower work function depending on the metal used. The PMOS gate will be formed from the gate having the higher work function.

Also, in accordance with the objects of the invention, a third method for forming dual-metal gate CMOS transistors is achieved. First and second active areas of a semiconductor substrate are separated by isolation regions. One of the active areas will be PMOS and the other will be NMOS. A gate dielectric layer is formed overlying the semiconductor substrate in each of the active areas. A metal layer is deposited overlying the gate dielectric layer. First silicon ions are implanted into the metal layer in a first active area to form an implanted metal layer and the implanted metal layer is silicided to form a first metal silicide layer. Second silicon ions are implanted into the metal layer in the second active area to form an implanted metal layer and the implanted metal layer is silicided to form a second metal silicide layer wherein the silicon concentration in the second metal silicide layer is higher than the silicon concentration in the first metal silicide layer. Thereafter, the first metal silicide layer and the second metal silicide layer are patterned to form a first metal silicide gate in the first area and a second metal silicide gate in the second area to complete formation of dual-metal gate CMOS transistors in the fabrication of an integrated circuit. The PMOS gate will be formed from the gate having the higher work function.

Also, in accordance with the objects of the invention, a fourth method for forming dual-metal gate CMOS transistors is achieved. First and second active areas of a semiconductor substrate are separated by isolation regions. One of the active areas will be PMOS and the other will be NMOS. A dummy gate is formed in each of the active areas. The dummy gates are covered with a dielectric layer which is planarized whereby a top surface of each of the dummy gates is exposed. The exposed dummy gates are removed, leaving gate openings to the semiconductor substrate. A gate dielectric layer is formed overlying the semiconductor substrate in each of the gate openings. A metal layer is deposited within the gate openings to form metal gates. First silicon ions are implanted into the metal gate only in a first active area to form an implanted metal gate. The implanted metal gate is silicided to form a first metal silicide gate in the first active area. Second silicon ions are implanted into the metal gate in the second active area to form an implanted metal gate and the implanted metal gate is silicided to form a second metal silicide gate wherein the silicon concentration in the second metal silicide gate is different from the silicon concentration in the first metal silicide gate to complete formation of dual-metal gate CMOS transistors in the fabrication of an integrated circuit. The PMOS gate will be formed from the gate having the higher work function.

Also, in accordance with the objects of the invention, a dual-metal gate CMOS integrated circuit device is achieved. The device comprises first and second active areas of a semiconductor substrate separated by isolation regions. One of the active areas will be PMOS and the other will be NMOS. A metal gate in the first active area overlies a gate dielectric layer, and a metal silicide gate in the second active area overlies a gate dielectric layer wherein the metal in the metal gate is the same material as the metal in the metal silicide gate. The metal silicide may have a higher or lower work function depending on the metal used. The PMOS gate will be formed from the gate having the higher work function.

Also, in accordance with the objects of the invention, another dual-metal gate CMOS integrated circuit device is achieved. The device comprises first and second active areas of a semiconductor substrate separated by isolation regions. One of the active areas will be PMOS and the other will be NMOS. A first metal silicide gate in the first active area overlies a gate dielectric layer, and a second metal silicide gate in the second active area overlies a gate dielectric layer wherein the metal in the two gates is the same metal and the silicon concentration is different in each of the two gates. The PMOS gate will be formed from the gate having the higher work function.

BRIEF DESCRIPTION OF THE DRAWINGS

In the accompanying drawings forming a material part of this description, there is shown.

DESCRIPTION OF THE PREFERRED EMBODIMENTS

The present invention uses a metal and its metal silicide to form dual-metal gates having different work functions. In one embodiment, two different suicides of the metal are used as the dual-metal gates. It will be understood by those skilled in the art that the invention should not be limited to the embodiments described herein, but can be extended and applied to any application in which it is desired to have metal gates having differing work functions. The first embodiment of the invention will be described with reference to FIGS. 1–5. The second embodiment of the invention will be described with reference to FIGS. 6–11. The third embodiment of the invention will be described with reference to FIGS. 12 and 13.

Figure 1:
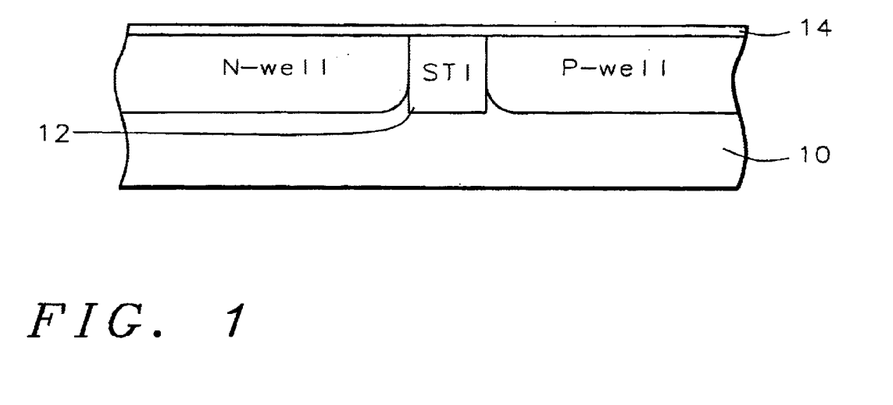
FIGS. 1 through 5 are cross-sectional representations of a first preferred embodiment of the present invention.

Referring now to FIGS. 1–5, the first preferred embodiment of the present invention will be described. Referring now more particularly to FIG. 1, there is shown a semiconductor substrate 10. This is preferably monocrystalline silicon. Isolation regions, such as shallow trench isolation (STI) 12, are formed in the substrate to separate active regions. N-wells and P-wells, may be formed within the substrate, as is conventional. Punchthrough and threshold voltage adjustment implantations, not shown, are made as is conventional in the art.

A gate dielectric layer 14 is grown or deposited over substrate to a thickness of between about 15 and 150 Angstroms. For example, the dielectric layer may be a low dielectric constant material such as silicon dioxide, nitrided silicon dioxide, silicon nitride, or their combinations. Alternatively, the dielectric layer may be a high dielectric constant gate dielectric material such as zirconium oxide, hafnium oxide, aluminum oxide, tantalum pentoxide, barium strontium titanates, and crystalline oxide.

Figure 2:
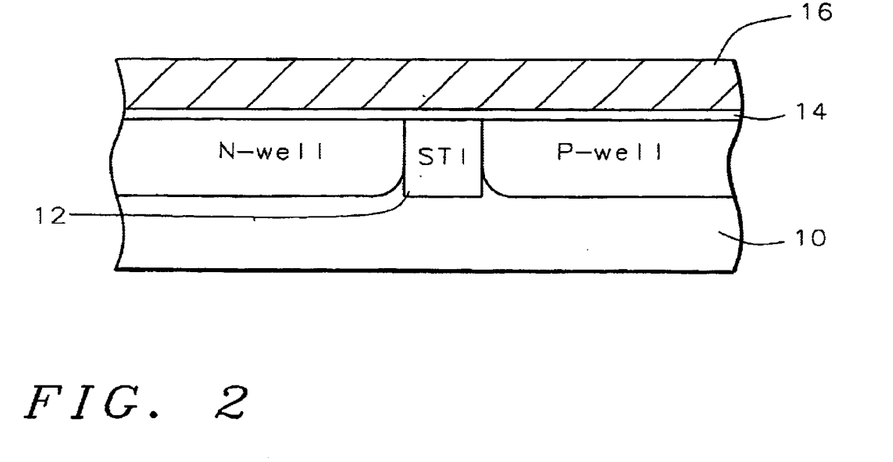

Referring now to FIG. 2, a metal layer 16 is formed over the gate dielectric layer to a thickness of between about 500 and 3000 Angstroms. The metal layer 16 may be formed by sputtering, evaporation, chemical vapor deposition (CVD), or electroplating. The deposited metal can be platinum, titanium, nickel, cobalt, tantalum, molybdenum, tungsten, zirconium, hafnium, vanadium, palladium, or chromium.

Figure 3:
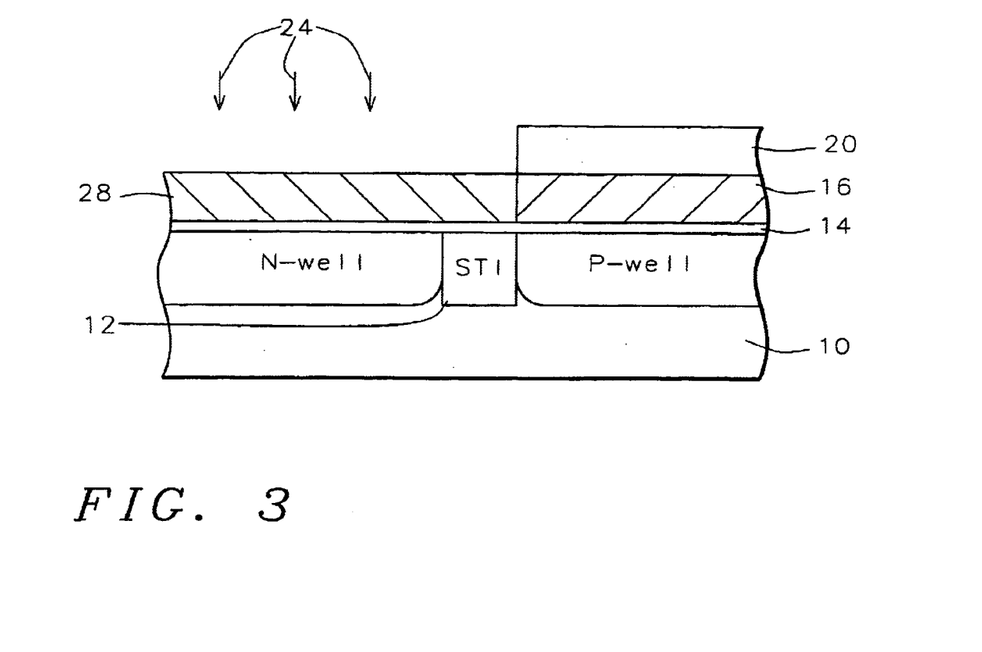

Now, the metal layer is masked 20, as shown in FIG. 3, to expose a region where the metal will be silicided. Silicon ions are implanted 24 into the metal layer 16 where it is not covered by the mask 20. Silicon ions are implanted with a dosage of between about 5 E 15 to 5 E 17 ions/cm$^2$ and an energy of between about 1 to 50 KeV. It is important that the masking layer is thick enough to protect the underlying metal layer from implantation. The silicidation process is now to be accomplished by annealing in an inert gas ambient. Annealing can be performed in a furnace, rapid thermal process (RTP), or a laser system. The photomask must be removed prior to annealing in the inert gas. Silicided metal region 28 is the result of the silicidation process.

Figure 4:
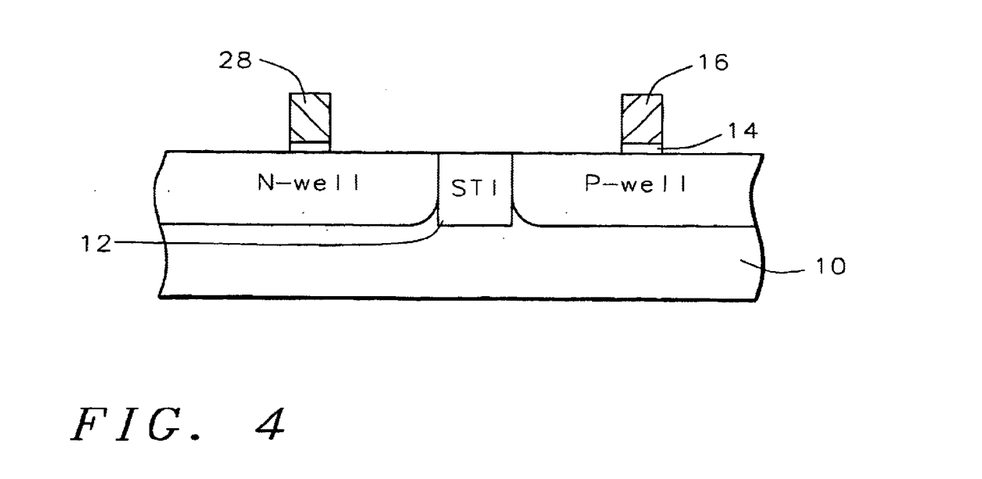

Referring now to FIG. 4, the metal and metal silicide layers, 16 and 28, respectively, are patterned to form gate electrodes. A chemical mechanical polishing (CMP) process may be applied to achieve planarization. In one embodiment, the silicide 28 is patterned to form the first gate electrode and, subsequently, the metal layer is patterned to form the second gate electrode. In another embodiment, both gate electrodes are defined and etched at the same time. The etching can be achieved by alternating chemistry 1 and chemistry 2 with time and using a high selectivity etch chemistry when the etch process is getting close to the end point, with chemistry 1 having a higher etch rate for silicide and chemistry 2 having a higher etch rate for the metal, or vice versa. Thus, metal gates 16 and 28, having different work functions, are realized.

The metal silicide gate 28 may have a higher or lower work function than the metal gate 16 depending on the metal used. The PMOS gate will be the gate having the higher work function and the NMOS gate will be the gate having the lower work function.

Figure 5:
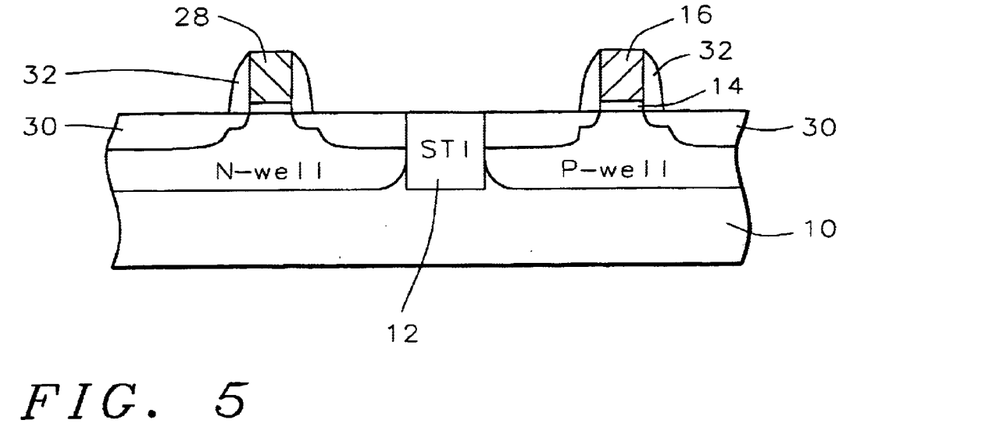

Referring now to FIG. 5, source/drain regions 30 and sidewall spacers 32 may be formed, as is conventional. The spacers 32 may comprise either silicon nitride or silicon oxide. Processing continues as is conventional in the art, except that silicidation over the gates is not required.

Figure 6:
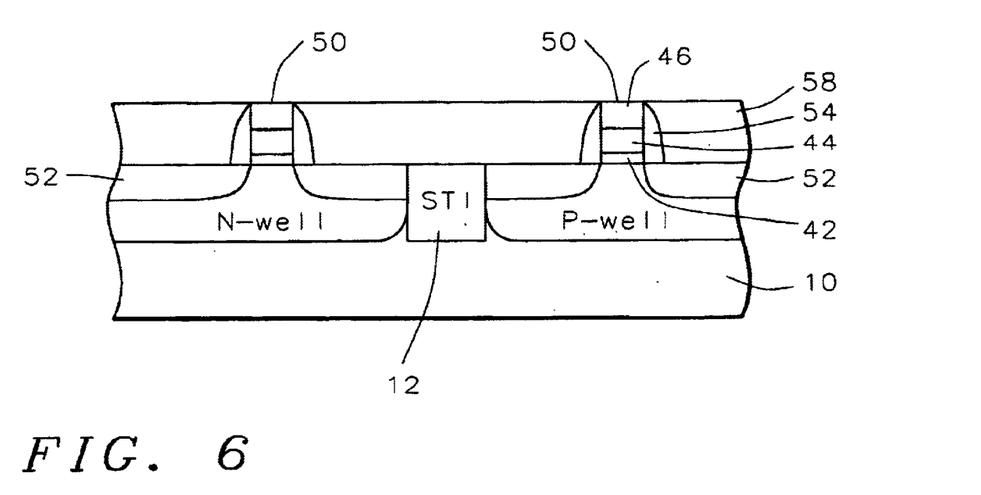
FIGS. 6 through 11 are cross-sectional representations of a second preferred embodiment of the present invention.

The second preferred embodiment of the present invention will be described with reference to FIGS. 6–11. This embodiment is a damascene gate process. Referring now more particularly to FIG. 6, there is shown a semiconductor substrate 10. This is preferably monocrystalline silicon. Isolation regions, such as shallow trench isolation (STI) 12, are formed in the substrate to separate active regions. N-wells and P-wells may be formed within the substrate, as is conventional. Punchthrough and threshold voltage adjustment implantations, not shown, are made as is conventional in the art.

Dummy gates are formed. A first layer of silicon oxide 42 is deposited over the substrate to a thickness of between about 15 and 150 Angstroms. A layer of silicon nitride 44 is deposited over the silicon oxide layer 42 to a thickness of between about 15 and 200 Angstroms. A layer of polysilicon 46 is deposited over the silicon nitride layer 44 to a thickness of between about 500 and 3000 Angstroms. The dummy gate stack is patterned to form a dummy gate 50 in each of the active areas, as shown in FIG. 6. Sidewall spacers 54 and source/drain regions 52 are formed as is conventional in the art. Now, an interlevel dielectric layer. 58 is deposited over the dummy gates and planarized to the top of the dummy gates by CMP.

Figure 7:
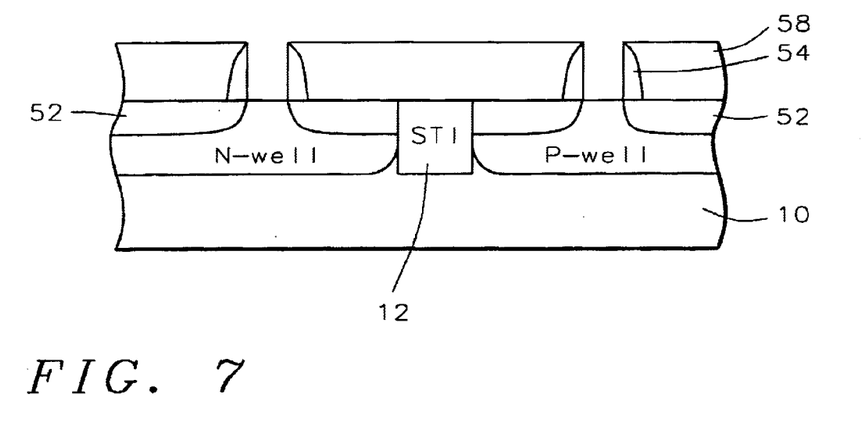

As shown in FIG. 7, the dummy gates 50 are removed where they are exposed by the CMP process. The dummy gates are removed by wet etching, dry etching, or a combination of the two.

Figure 8:
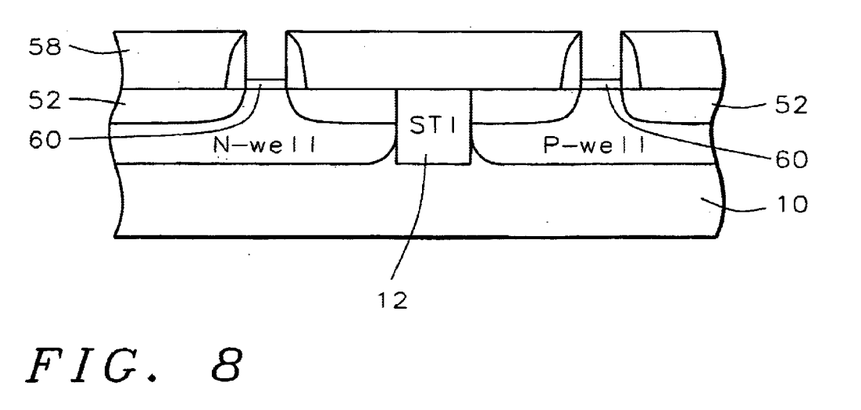

Now, the dual-metal gates of the present invention are to be formed. A gate dielectric layer 60 is deposited or thermally grown on the exposed substrate surface within the gate openings to a thickness of between about 15 and 150 Angstroms, as shown in FIG. 8. As in the first embodiment, the dielectric layer may be a low dielectric constant material such as silicon dioxide, nitrided silicon dioxide, silicon nitride, or their combinations or a high dielectric constant gate dielectric material such as zirconium oxide, hafnium oxide, aluminum oxide, tantalum pentoxide, barium strontium titanates and crystalline oxide.

Figure 9:
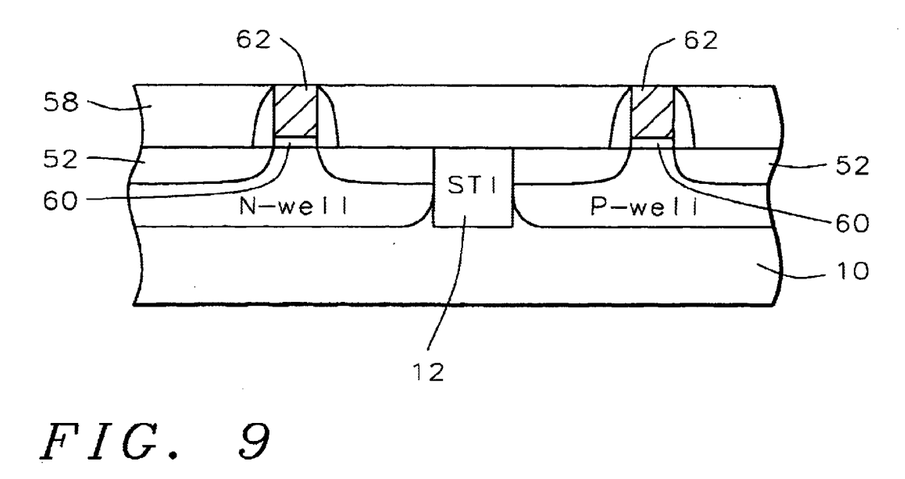

Referring now to FIG. 9, a metal layer 62 is formed over the gate dielectric layer 60. The metal layer 62 may be deposited by sputtering or CVD, for example. The deposited metal can be platinum, titanium, nickel, cobalt, tantalum, molybdenum, tungsten, zirconium, hafnium, vanadium, palladium, or chromium. A CMP process polishes away the metal layer not within the gate openings, thus completing the damascene process.

Figure 10:
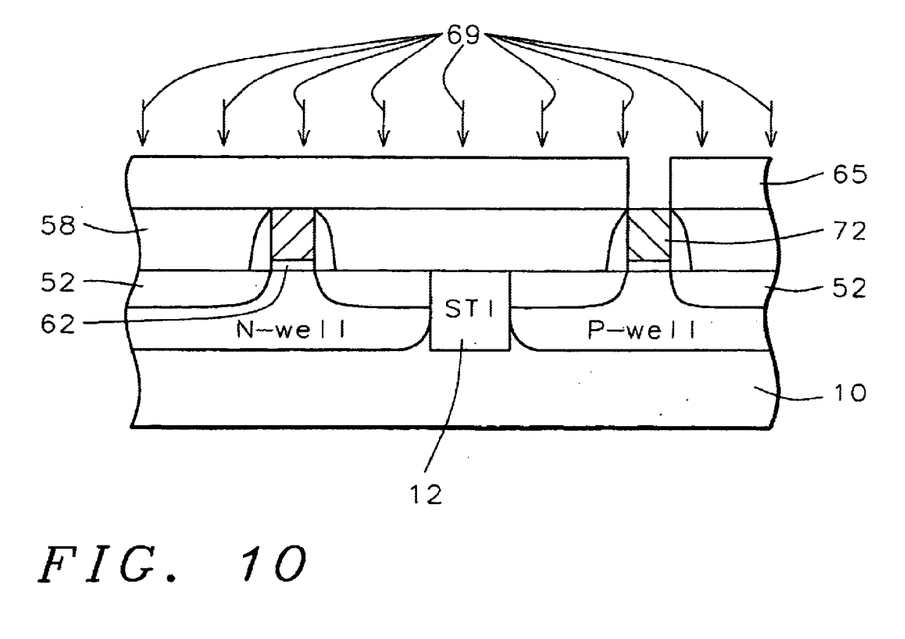

Now, as shown in FIG. 10, a photomask 65 is formed to cover the intermetal dielectric layer 58 and the first gate. An opening is formed in the photomask to expose only the second gate that is to be silicided. Silicon ions are implanted 69 by a low energy implanter into the second gate where it is not covered by the mask 65. Silicon ions are implanted with a dosage of between about 5 E 15 to 5 E 17 ions/cm² and an energy of between about 1 to 50 KeV. It is important that the masking layer is thick enough to protect the first gate from implantation.

After stripping the photomask 65, an annealing step in an inert gas or a vacuum is performed to form a silicide from the silicon-implanted metal 72.

Figure 11:
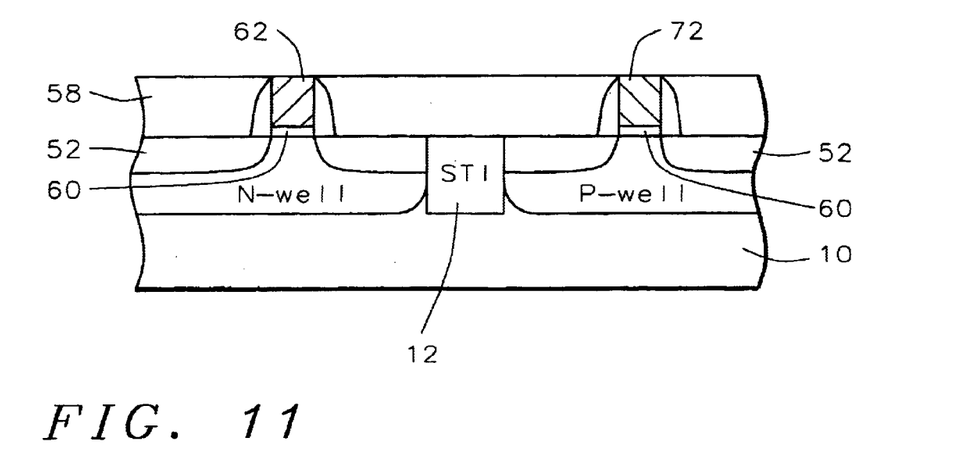

As shown in FIG. 11, metal gates 62 and 72, having different work functions, are realized. Gate 62 comprises a metal while gate 72 comprises metal silicide. The gate electrode with the higher work function will be the PMOSFET while the gate electrode with the lower work function will be the NMOSFET.

The work functions of the gate electrodes of the first two embodiments have been measured as shown in Table 1. The resistivity of almost all metals and their silicides is much lower than the resistivity of polysilicon.

TABLE 1

| gate material | work func (eV) |
| --- | --- |
| Pt | 5.32–5.5 |
| PtSi$_2$ | ~4.62 |
| Ti | 3.95–4.33 |
| TiSi$_2$ | ~4.38 |
| Ni | 4.5–5.3 |
| NiSi$_2$ | ~4.55 |
| Co | 4.41–5.00 |
| CoSi$_2$ | ~4.52 |
| Ta | 4.12–4.25 |
| TaSi$_2$ | ~4.35 |
| Mo | 4.3–4.6 |
| MoSi$_2$ | ~4.42 |
| W | 4.1–5.2 |
| WSi$_2$ | ~4.43 |
| Zr | 3.9–4.05 |
| ZrSi$_2$ | ~4.33 |
| Hf | N/A |
| HfSi$_2$ | N/A |
| V | 4.12–4.3 |
| VSi$_2$ | ~4.37 |
| Pd | 4.8–5.22 |
| PdSi | ~4.6 |
| Cr | 4.5–4.6 |
| CrSi$_2$ | ~4.41 |

The dual-metal gate can also be realized by adjusting the work function of the silicides since the work function of the metal suicides is closely related to the stoichiometry. That is, one gate electrode will be in the form of MSi$_X$ while the other gate electrode will be in the form of MSi$_Y$, where M is a metal which can be platinum, titanium, nickel, cobalt, tantalum, molybdenum, tungsten, zirconium, hafnium, vanadium, palladium, or chromium, and X is not equal to Y. The value of X and Y can be well adjusted by the implantation dose. The methods described for the first and second embodiments can also be used in this third embodiment dual-gate process.

Figure 12:
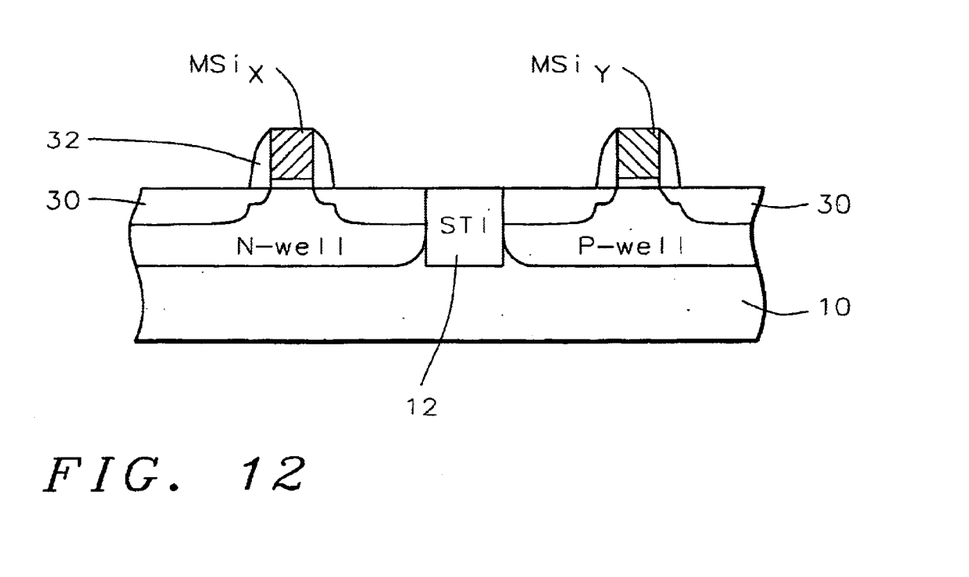
FIGS. 12 and 13 are cross-sectional representations of two alternatives of a third preferred embodiment of the present invention.

As shown in FIG. 12, the conventional gate formation process described in the first embodiment can be used to form the two gates MSi$_X$ and MSi$_Y$. The metal layer can be implanted with two different dosages of silicon ions to form these two metal silicide gates having different work functions. For example, a first silicon ion dosage of between about 1 E 15 and 1 E 16 ions/cm² will form a gate having a lower work function and a second silicon ion dosage of between about 1 E 16 and 1 E 17 ions/cm² will form a gate having a higher work function.

Alternatively, instead of depositing an elemental metal layer for gate electrode 1, a silicide with a certain M/Si ratio can be deposited by CVD or sputtering. This will form the first gate electrode MS$_X$. The stoichiometry of the second electrode MS$_Y$ can be adjusted by the silicon ion implantation as described with for the first embodiment. For example, the silicon concentration of the first gate electrode having a lower work function is between about 1 E 21 and 1 E 22 ions/cm³ and the silicon concentration of the second gate electrode having a higher work function is between about 1 E 22 and 1 E 23 ions/cm³.

Figure 13:
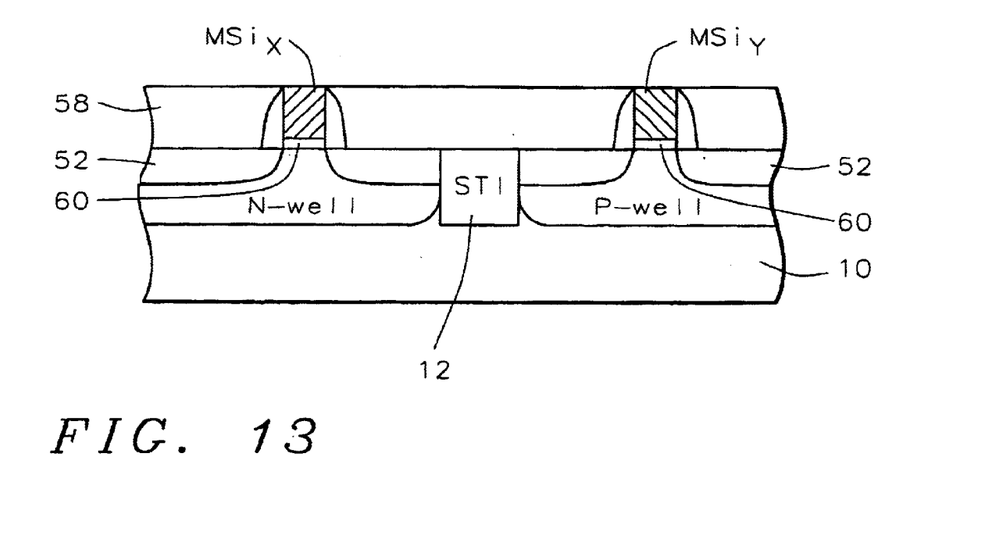

As shown in FIG. 13, the damascene gate process described in the second embodiment can be used to form the two gates $MS_X$ and $MS_Y$. The gates will each be implanted with different dosages of silicon ions to form these two metal silicide gates having different work functions. Again, As an alternative, instead of depositing an elemental metal layer for gate electrode 1, a silicide with a certain M/Si ratio can be deposited by CVD or sputtering. This will form the first gate electrode $MSi_X$. The stoichiometry of the second electrode $MS_Y$ can be adjusted by the silicon ion implantation as described with for the second embodiment.

The process of the present invention provides three simple, manufacturable dual-metal gate processes. The conventional CMOS process flow is maintained. The work function of the gates is simply tuned by the silicidation process. The dual-metal gates comprise a metal and a metal silicide, or two metal silicides having different work functions. The metal silicide having the higher work function will be used for the PMOS gate and the metal silicide having the lower work function will be used for the NMOS gate.

While the invention has been particularly shown and described with reference to the preferred embodiments thereof, it will be understood by those skilled in the art that various changes in form and details may be made without departing from the spirit and scope of the invention.

What is claimed is:

1. A dual-metal gate CMOS integrated circuit device comprising:
   an NMOS active area and a PMOS active area of a semiconductor substrate separated by isolation regions;
   a metal gate in said NMOS area over a gate dielectric layer; and
   a metal silicide gate in said PMOS area over a gate dielectric layer wherein said metal in said metal gate is the same material as said metal in said metal silicide gate and wherein said metal silicide gate in said PMOS area has a higher work function than said metal gate in said NMOS area.

2. The device according to claim 1 wherein said gate dielectric layer is selected from the group containing silicon dioxide, nitrided silicon dioxide, silicon nitride, and a combination thereof.

3. The device according to claim 1 wherein said gate dielectric layer is selected from the group containing zirconium oxide, hafnium oxide, aluminum oxide, tantalum pentoxide, barium strontium titanates, and crystalline oxides.

4. The device according to claim 1 wherein said metal layer is selected from the group containing platinum, titanium, nickel, cobalt, tantalum, molybdenum, tungsten, zirconium, hafnium, vanadium, palladium, and chromium.

5. A dual-metal gate CMOS integrated circuit device comprising:
   an NMOS active area and a PMOS active area of a semiconductor substrate separated by isolation regions;
   a metal gate in said PMOS area over a gate dielectric layer; and
   a metal silicide gate in said NMOS area over a gate dielectric layer wherein said metal in said metal gate is the sane material as said metal in said metal silicide gate and wherein said metal gate in said PMOS area has a higher work function than said metal silicide gate in said NMOS area.

6. The device according to claim 5 wherein said gate dielectric layer is selected from the group containing silicon dioxide, nitrided silicon dioxide, silicon nitride, and a combination thereof.

7. The device according to claim 5 wherein said gate dielectric layer is selected from the group containing zirconium oxide, hafnium oxide, aluminum oxide, tantalum pentoxide, barium strontium titanates, and crystalline oxides.

8. The device according to claim 5 wherein said metal layer is selected from the group containing platinum, titanium, nickel, cobalt, tantalum, molybdenum, tungsten, zirconium, hafnium, vanadium, palladium, and chromium.

\* \* \* \* \*